United States Patent
Chiu et al.

(10) Patent No.: US 8,388,181 B2
(45) Date of Patent: Mar. 5, 2013

(54) LIGHT SOURCE ASSEMBLY USING LIGHT EMITTING DIODES AND REFLECTIVE SHEET SET

(75) Inventors: Kuan Her Chiu, Changhua County (TW); Irene Chen, Taoyuan County (TW); Jian Shihn Tsang, Taipei County (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 584 days.

(21) Appl. No.: 12/556,123

(22) Filed: Sep. 9, 2009

(65) Prior Publication Data

US 2010/0067220 A1 Mar. 18, 2010

(30) Foreign Application Priority Data

Sep. 17, 2008 (TW) ................................ 97135568 A

(51) Int. Cl.
*F21S 4/00* (2006.01)
*F21V 21/00* (2006.01)

(52) U.S. Cl. .................. 362/249.02; 362/227; 362/231; 362/612

(58) Field of Classification Search ............. 362/249.02, 362/227, 230, 231, 362, 363, 800, 249.01, 362/91.7–97.4, 612, 555, 561, 646, 341, 362/342, 346, 349

See application file for complete search history.

(56) References Cited

U.S. PATENT DOCUMENTS

| 2004/0218388 A1* | 11/2004 | Suzuki ........................ 362/231 |
| 2005/0185419 A1* | 8/2005 | Holman et al. ............... 362/561 |
| 2008/0101069 A1* | 5/2008 | Chang ......................... 362/247 |

FOREIGN PATENT DOCUMENTS

| CN | 2606897 Y | 3/2004 |
| WO | 2008082105 A1 | 7/2008 |
| WO | 2008114882 A1 | 9/2008 |

* cited by examiner

*Primary Examiner* — Evan Dzierzynski
*Assistant Examiner* — Danielle Allen
(74) *Attorney, Agent, or Firm* — Altis Law Group, Inc.

(57) ABSTRACT

A light source assembly comprises a plurality of reflective sheets, a plurality of light emitting diodes and a printed circuit board. Each reflective sheet comprises a plate member and a plurality of openings formed on the plate member. The plurality of light emitting diodes are mounted on the printed circuit board. The plurality of reflective sheets are also mounted on the printed circuit board. The plurality of light emitting diodes are respectively located in the openings. The light emitted from the light emitting diodes is reflected by the surface of the plate member.

17 Claims, 7 Drawing Sheets

LIGHT SOURCE ASSEMBLY USING LIGHT EMITTING DIODES AND REFLECTIVE SHEET SET

BACKGROUND OF THE INVENTION

1. Field of the Invention

The present invention relates to a light source assembly using light emitting diodes and a reflective sheet set, and relates more particularly to a light source assembly and the reflective sheet set thereof for the backlight module of a liquid crystal display.

2. Description of the Related Art

Light emitting diodes (LED) have advantages of lower power consumption, high conversion efficiency and extended lifetime, and will not contribute to the environmental problem of mercury pollution. Further, they exhibit excellent color performance when used in a backlight module, and the application of light emitting diodes in display apparatuses has recently become a focus of much research and development.

Based on configuration and position of light source, backlight modules can be divided into two types: a direct-lit backlight configuration and an edge-lit backlight configuration. In the past, the main applications of liquid crystal display have been in notebook computers and liquid crystal display screens. The requirements of such applications for the backlight modules are light weight, low volume, and narrow profile, and the configuration of edge-lit backlight modules can satisfy these requirements. However, when a backlight module for a super large liquid crystal screen is developed, the main considerations are sufficient illumination for the screen, wide viewing angles, high-contrast display, and extended lifetime. In view of the above considerations, development of the direct-lit backlight configuration is of a highest priority.

Referring to FIG. 1, a present liquid crystal display using a direct-lit backlight module as its light source assembly 10 comprises a reflective sheet 11, a plurality of light emitting diodes 12 and a printed circuit board 13. The plurality of light emitting diodes 12 are mounted on the printed circuit board 13. The reflective sheet 11 is also mounted on the printed circuit board 13. The reflective sheet 11 comprises a plate 111 and a plurality of holes 112 formed on the plate 111. The plurality of light emitting diodes 12 are separately situated in the plurality of holes 112, protruding above the holes 112. Each light emitting diode 12 initially emits light into an above-disposed diffusing plate (not shown), producing reflected light. The plate 111 recovers and reuses the reflected light, or reflects the reflected light back to the diffusing plate.

As liquid crystal displays become larger, the dimension of the light source assembly 10 using light emitting diodes and a reflective sheet 11 needs to increase. Regarding the manufacture of the reflective sheet 11, the reflective sheet 11 is made of a metal plate 111, through which a plurality of holes 112 are punched using a punch. However, to meet the precision requirement of the hole positions, the manufacturing cost of the punching mold is high. In addition, reflective sheets 11 having hundreds of holes 112 have higher per-unit costs of manufacture and are difficult to position when they are assembled. For example, if a reflective sheet 11 has some of its holes 112 misaligned or defective, the entire reflective sheet 11 needs to be scraped. In addition, hundred of holes 112 all have to be respectively aligned with the light emitting diodes 12 to accomplish the assembly of the light source assembly 10.

When the light source assembly 10 adopts high power light emitting diodes 12, the high intensity light emitting diodes 12 generate more heat. Heat accumulation may increase the temperature of a printed circuit board, resulting in decreasing intensity of the light emitting diodes 12. Consequently, high intensity light emitting diodes 12 need to be spaced farther apart, causing non-uniform light emission issue of the light source assembly 10. To avoid non-uniformity issue, low power light emitting diodes 12 are used to replace the high power light emitting diodes 12 and are arranged more densely. As a result, the number of holes 112 increases such that the issues of high manufacturing cost of the reflective sheets 11 and the difficulty in assembling the reflective sheets 11 become significant.

SUMMARY OF THE INVENTION

The present invention provides a light source assembly using light emitting diodes and a reflective sheet set thereof. A modularized reflective sheet set is proposed to resolve the above-mentioned issues of manufacture cost and assembly, and is also more suitable for large sizes of liquid crystal screens.

In order to provide a solution for the above technical issues, the present invention provides a light source assembly using light emitting diodes. The light source comprises a plurality of reflective sheets, a plurality of light emitting diodes, and a printed circuit board. Each reflective sheet comprises a plate member and a plurality of openings formed on the plate member. The plurality of light emitting diodes are mounted on the printed circuit board. The plurality of reflective sheets are also mounted on the printed circuit board. The plurality of reflective sheets are connected and assembled together on the printed circuit board, and the light emitting diodes are located in the openings of the assembled reflective sheets. Therefore, the surfaces of the plate members can reflect the light from the light emitting diodes.

The present invention provides another light source assembly using light emitting diodes. The light source comprises a plurality of first reflective sheets, a plurality of second reflective sheets, a plurality of light emitting diodes and a printed circuit board. Each second reflective sheet comprises a second plate member and a plurality of openings disposed on the second plate member, and each first reflective sheet comprises a first plate member. The plurality of light emitting diodes are mounted on the printed circuit board. Also, the plurality of first and second reflective sheets are mounted on the printed circuit board. The plurality of first and second reflective sheets are arranged in an interlacing manner on the printed circuit board, and the plurality of light emitting diodes are respectively disposed in the plurality of openings. As a result, the surfaces of the first and second plate members can reflect the light from the light emitting diodes.

The present invention further provides a reflective sheet set comprising a plurality of reflective sheets, a first release sheet and a second release sheet. The plurality of reflective sheets are disposed between the first release sheet and the second release sheet, and each reflective sheet comprises a plate member and a plurality of openings disposed on the plate member.

To better understand the above-described objectives, characteristics and advantages of the present invention, embodiments, with reference to the drawings, are provided for detailed explanations.

BRIEF DESCRIPTION OF THE DRAWINGS

The invention will be described according to the appended drawings in which.

DETAILED DESCRIPTION OF THE INVENTION

Figure 1:
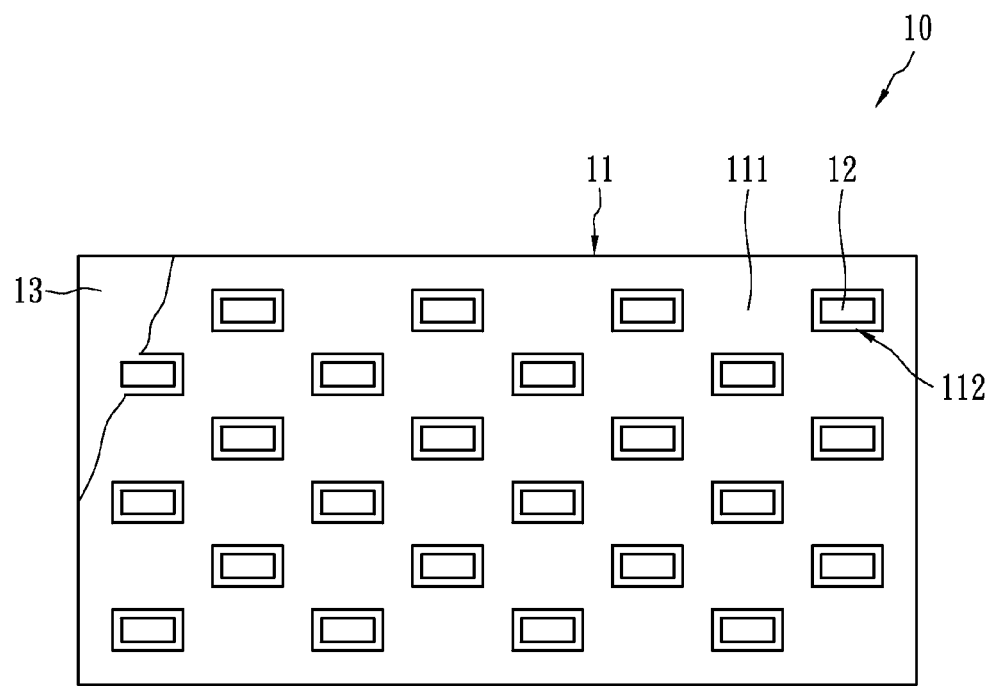
FIG. 1 is a top view showing the direct-lit backlight module of a traditional liquid crystal display.

The present invention proposes a light source assembly using light emitting diodes. The light source assembly comprises a printed circuit board; a plurality of reflective sheets mounted on the printed circuit board, wherein each reflective sheet comprises a plate member and a plurality of openings formed on the plate member, and the reflective sheet can be a thin metal sheet; and a plurality of light emitting diodes mounted on the printed circuit board; wherein the light emitting diodes are located in the openings of the assembled reflective sheets. The reflective sheet includes at least one longitudinal edge having a castellated profile, and the plurality of openings are the concave portions of the longitudinal edge having a castellated profile. Each longitudinal edge having a castellated profile is connected to an longitudinal straight edge of an adjacent reflective sheet.

The present invention provides another light source assembly using light emitting diodes. The light source comprises a printed circuit board; a plurality of first reflective sheets mounted on the printed circuit board, each comprising a first plate member; a plurality of second reflective sheets mounted on the printed circuit board, each comprising a second plate member and a plurality of openings disposed on the second plate member, wherein the first and second plate members are made of a thin metal plate; and a plurality of light emitting diodes mounted on the printed circuit board. The plurality of first and second reflective sheets are arranged in an interlacing manner on the printed circuit board, and the plurality of light emitting diodes are respectively disposed in the plurality of openings. The reflective sheet includes at least one longitudinal edge having a castellated profile, and the plurality of openings is the concave portions of the elongated edge having a castellated profile. Each longitudinal edge having a castellated profile is connected to an elongated straight edge of an adjacent reflective sheet.

The present invention provides a reflective sheet set comprising a first release sheet, a second release sheet and a plurality of reflective sheets. The reflective sheet is a thin metal sheet. The plurality of reflective sheets are disposed between the first release sheet and the second release sheet, and each reflective sheet comprises a plate member and a plurality of openings disposed on the plate member. The reflective sheet includes at least one longitudinal edge having a castellated profile, and the plurality of openings is the concave portions of the longitudinal edge having a castellated profile. Each longitudinal edge having a castellated profile is connected to an longitudinal straight edge of an adjacent reflective sheet.

The above-described technical contents and technical characteristics of the present invention are intended to be illustrative only. Numerous alternative embodiments may be devised by persons skilled in the art without departing from the scope of the present invention.

Figure 2A:
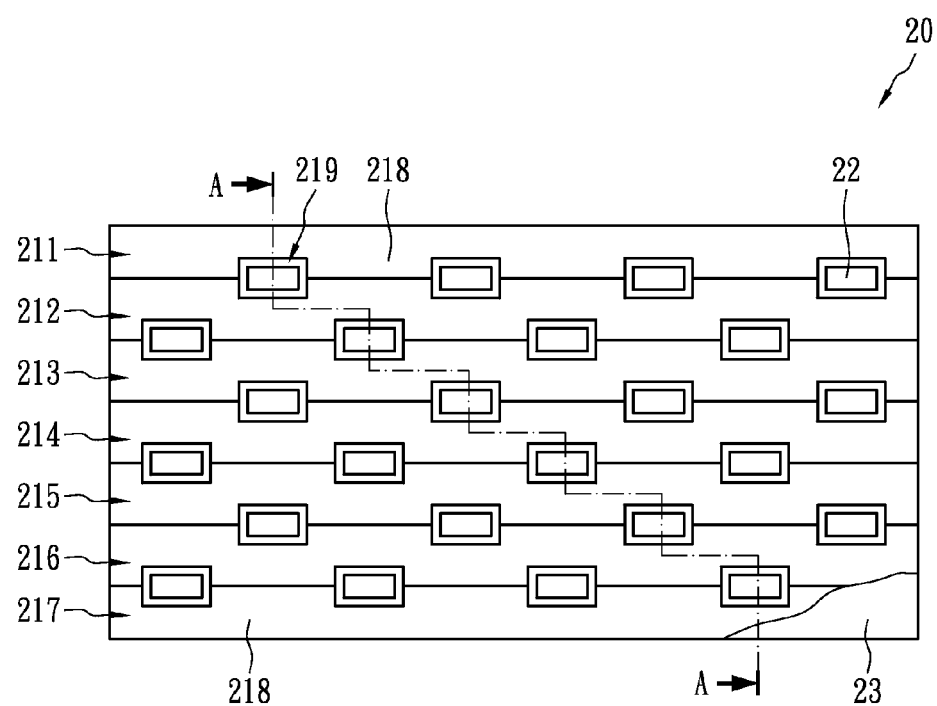
FIG. 2A is a top view showing a light source assembly using light emitting diodes according to one embodiment of the present invention.

To facilitate a clear understanding of the present invention, figures and explanations are provided as follows:

Referring to FIG. 2A, the light source assembly 20 using light emitting diodes, according to one embodiment of the present invention, comprises a plurality of reflective sheets 211-217, a plurality of light emitting diodes 22 and a printed circuit board 23. Each of the reflective sheets 211-217 comprises a plate member 218 and a plurality of openings 219 formed on the plate member 218, wherein the reflective sheets 212-216 have the same shape. Although the edges of the reflective sheets 211 and 217 are different from those of the reflective sheets 212-216, they all can be manufactured using the same type of sheet. Therefore, the manufacturing cost can be reduced. The plurality of light emitting diodes 22 are mounted on the printed circuit board 23. The plurality of reflective sheets 211-217 are also mounted on the printed circuit board 23. The reflective sheets 211-217 are sequentially attached to each other. The reflective sheets 211-217 can be easily assembled and fixed, the assembly quantity thereof increased, and the dimensions can be changed to adapt to the size of a backlight module. In other words, reflective sheets 211-217 of different lengths can be trimmed or selected according to the sizes of backlight modules, being assembled and connected using the similar method on the printed circuit board. The plurality of light emitting diodes 22 are disposed separately in the plurality of openings 219, emitting light reflected by the surface of the plate member 218.

The modularized reflective sheets 211-217 are flexible, and can be changed in size and increased in number to adapt for the dimension of a light source assembly. Each of the reflective sheets 211-217 has fewer openings 219 so that the requirements for precision and cumulative tolerance are not critical, and the alignment and positioning thereof during assembly is easy. Compared to traditional reflective sheets, which are not easily manufactured and have the issue of low production yield, the technique of the present invention can reduce the manufacture cost of a light source assembly 20 and a backlight module.

Figure 2B:
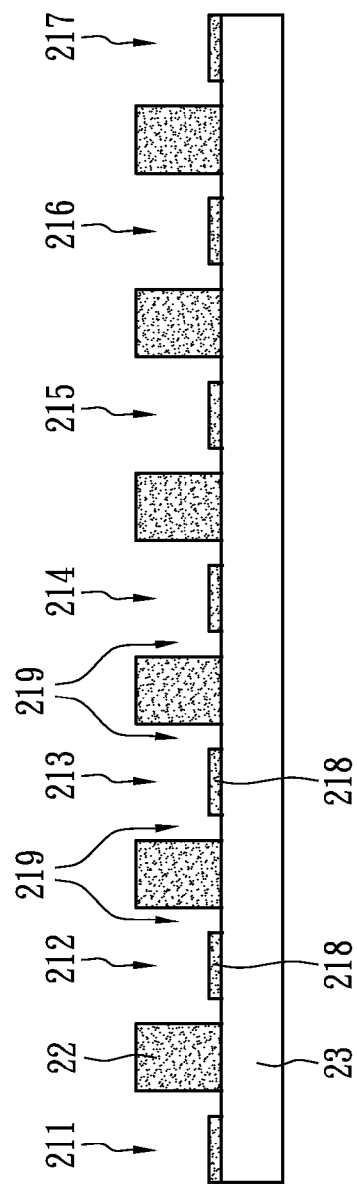
FIG. 2B is a cross sectional view taken along line A-A in FIG. 2A.

FIG. 2B is a cross sectional view taken along line A-A in FIG. 2A. The plurality of reflective sheets 211-217 are serially connected. The openings 219 of the plurality of reflective sheets 211-217 allow the light emitting diodes 22 to protrude above the surface of the plate member 218. Therefore, light beams emitted toward the surface of the plate member 218 can be upwards reflected by the reflective surface of the plate member 218 so as to increase the efficiency of light utility of a backlight module. On the other hand, a portion of light, emitted from light emitting diodes 22, entering an above diffusing plate (not shown), reflected by the diffusing plate becomes reflected light. The plate member 218 can recover and reuse the reflected light. Namely, the plate member 218 can reflect the reflected light back to the diffusing plate. The plate member 218 can be a thin metal plate such as an aluminum plate, or can be a plastic plate capable of reflection.

Figure 3:
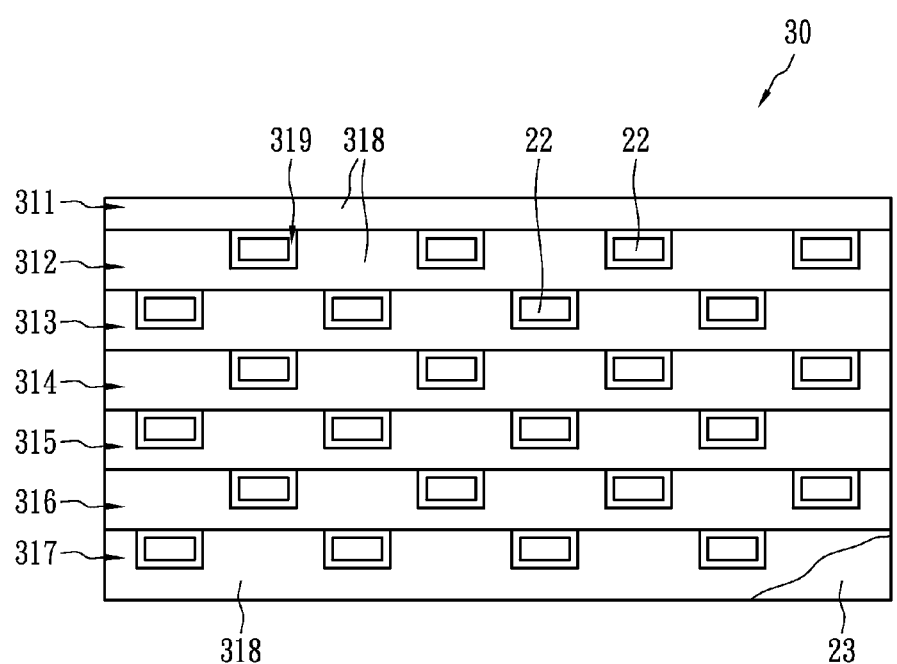
FIG. 3 is a top side view showing a light source assembly using light emitting diodes according to another embodiment of the present invention.

FIG. 3 is a top side view showing a light source assembly 30 using light emitting diodes according to another embodiment of the present invention. The light source assembly 30 using light emitting diodes comprises a plurality of reflective sheets 311-317, a plurality of light emitting diodes 22 and a printed circuit board 23. Each of the reflective sheets 311-317 comprises a plate member 318 and a plurality of openings 319 disposed on the plate member 318, wherein the reflective sheets 312-317 have a similar shape. The reflective sheet 311 is a rectangular plate member 318 having no opening 319. The plurality of light emitting diodes 22 are mounted on the printed circuit board 23. Also, the plurality of reflective sheets 311-317 are mounted on the printed circuit board 23. Compared to FIG. 2A, each opening 319 receiving a respective light emitting diode 22 is formed on one of the reflective sheets 311-317 rather than being formed by assembling two halves each from one of two adjacent reflective sheets 311-317. The shapes and locations of the openings 319 are not limited to the embodiments of the present invention, and the dimensions and shape of the reflective sheet can vary extensively. For example, two reflective sheets 312 and 313 can be combined as a single reflective sheet.

Figure 4:
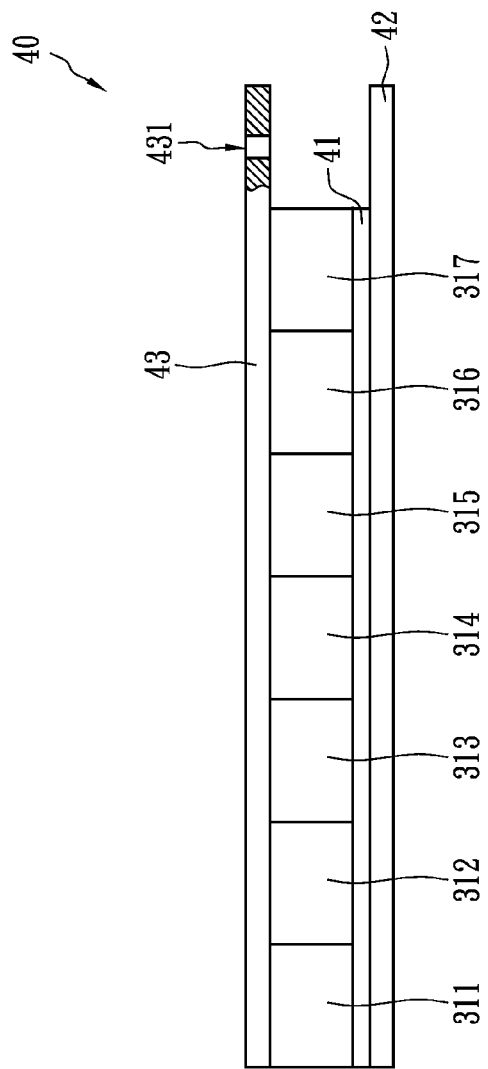
FIG. 4 is a side view showing a reflective sheet set according to one embodiment of the present invention.

FIG. 4 is a side view showing a reflective sheet set according to one embodiment of the present invention. The reflective sheet set 40 comprises a plurality of reflective sheets 311-317, a first release sheet 42 and a second release sheet 43. The plurality of reflective sheets 311-317 are arrayed in advance, placed between the first release sheet 42 and the second release sheet 43. The surfaces of the first release sheet 42 and the second release sheet 43, adjacent to the reflective sheets 311-317, can be adhesive so that the reflective sheets 311-317 can be serially fixed. The first release sheet 43 comprises a positioning hole 431 close to one edge thereof. The positioning hole 431 can be used for alignment with a positioning hole on a printed circuit board 23 for positioning the reflective sheets 311-317 relative to the printed circuit board 23 before they are assembled together. Before assembly, the second release sheet 43 is removed first. The surface of the reflective sheets 311-317 configured for attachment can be coated with an adhesive 41, to which the printed circuit board 23 can be attached. After the assembly is completed, the first release sheet 42 is then removed. Consequently, the reflective sheet set 40 can be easily positioned and quickly assembled. Using the reflective sheet set 40, the plurality of reflective sheets 311-317 can be positioned and attached to a printed circuit board 23 all at one time, without need to position and place one piece after another. Therefore, the reflective sheet set 40 is suitable for mass production of a backlight module or other planar light source.

Figure 5:
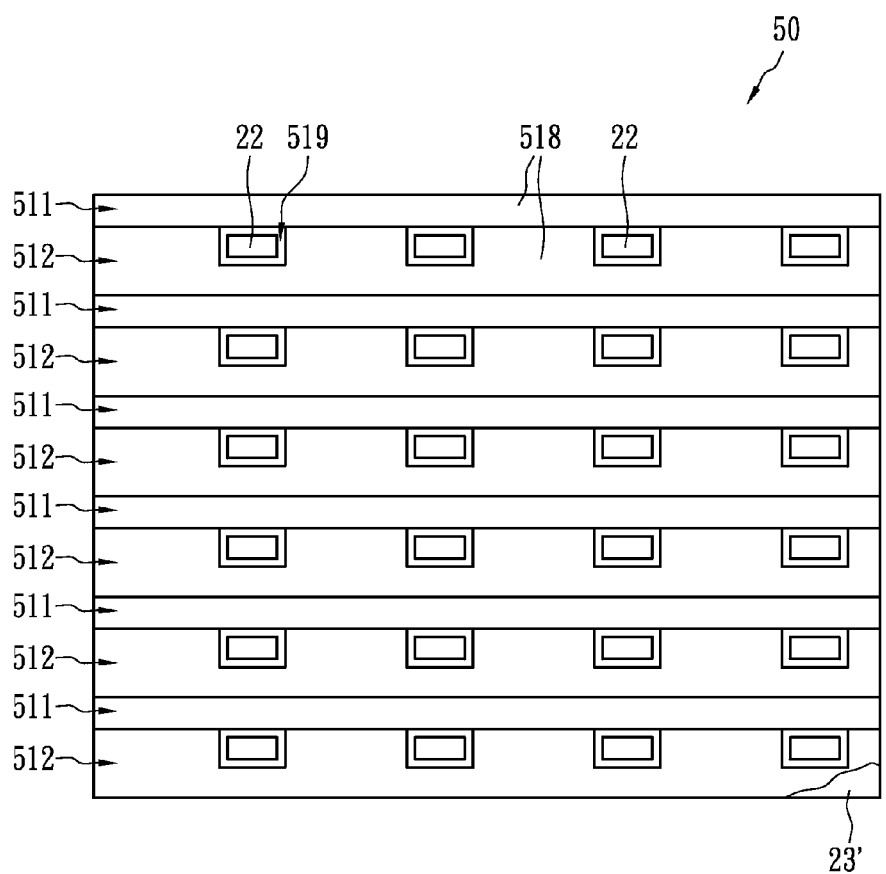
FIG. 5 is a top view showing a light source assembly using light emitting diodes according to another embodiment of the present invention.

FIG. 5 is a top view showing a light source assembly 50 using light emitting diodes according to another embodiment of the present invention. As shown in FIG. 5, the light source assembly 50 using light emitting diodes comprises a plurality of first reflective sheets 511, a plurality of second reflective sheets 512, a plurality of light emitting diodes 22, and a printed circuit board 23'. Each second reflective sheet 512 having a castellated profile comprises a plate member 518 with a plurality of openings 519 disposed on the plate member 518. In other words, each second reflective sheet 512 includes a longitudinal edge having a castellated profile, and the plurality of openings 519 are the concave portions of the castellated longitudinal edge. Each first reflective sheet 511 includes a plate member 518 having no opening. The first reflective sheet 511 and the second reflective sheet 512 are connected in an interlacing manner. Namely, one first reflective sheet 511 is disposed between two adjacent second reflective sheets 512. The longitudinal castellated edge of each second reflective sheet 512 is connected to one longitudinal straight edge of an adjacent first reflective sheet 511. The plurality of light emitting diodes are mounted on the printed circuit board 23', and the plurality of first reflective sheets 511 and the plurality of second reflective sheets 512 are also mounted on the printed circuit board 23'.

The plurality of first reflective sheets 511 and the plurality of second reflective sheets 512, connected in an interlacing manner, can be easily assembled and fixed. In addition, the assembly quantity of the first reflective sheets 511 and the second reflective sheets 512 can be increased and the dimensions of the first reflective sheets 511 and the second reflective sheets 512 can be changed to adapt for the size of a backlight module. In other words, the first reflective sheets 511 and the second reflective sheets 512 of different lengths can be trimmed or selected according to the sizes of backlight modules, then assembled and connected using the similar method on the printed circuit board. The plurality of light emitting diodes 22 are separately disposed in the plurality of openings 519, emitting light reflected by the surface of the plate member 218.

Figure 6:
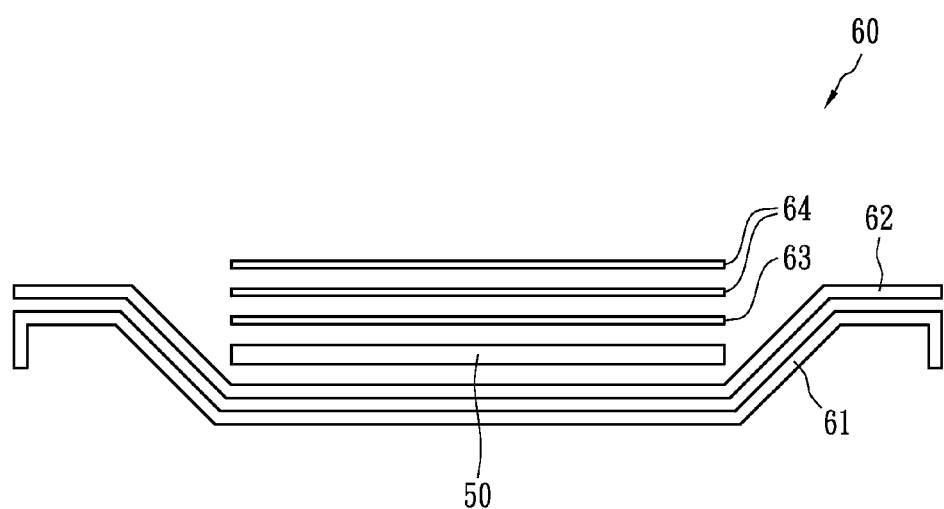
FIG. 6 is a side view showing a light source module according to one embodiment of the present invention.

FIG. 6 is a side view showing a light source module 60 according to one embodiment of the present invention. The light source module 60 comprises a back frame 61, a reflective sheet 62, a light source assembly 50, a diffusing plate member 63 and at least one optical film 64. The diffusing plate member 63 above the light source assembly 50 can uniformly diffuse the light from a plurality of light emitting diodes 22 such that the light source module 60 acts as a planar light source emitting light upward. The optical film 64 converges light beams so as to increase the utility of the light beams. The back frame 61 can accommodate the components of the light source module 60, and the reflective sheet 62 can reflect light traveling downward or reflecting downward back to the light output surface of the light source module 60.

The above-described embodiments of the present invention are intended to be illustrative only. Numerous alternative embodiments may be devised by persons skilled in the art without departing from the scope of the following claims.

What is claimed is:

1. A light source assembly using light emitting diodes, comprising:
    a printed circuit board;
    a plurality of reflective sheets mounted on the printed circuit board, each reflective sheet comprising a plate member and a plurality of openings formed on the plate member; and
    a plurality of light emitting diodes mounted on the printed circuit board;
    wherein the light emitting diodes are located in the openings of the assembled reflective sheets; and
    wherein each reflective sheet includes at least one longitudinal edge having an uneven profile with a plurality of concave portions, and the plurality of openings are formed by the concave portions of the at least one longitudinal edge having the uneven profile.

2. The light source assembly using light emitting diodes of claim 1, wherein the plurality of reflective sheets are serially connected on the printed circuit board.

3. The light source assembly using light emitting diodes of claim 1, wherein the light emitting diodes are respectively located in the openings of the reflective sheets.

4. The light source assembly using light emitting diodes of claim 1, wherein each of the light emitting diodes is disposed in two connected openings of two adjacent reflective sheets.

5. The light source assembly using light emitting diodes of claim 1, wherein the plate members of the plurality of the reflective sheets reflect light emitted from the plurality of light emitting diodes.

6. The light source assembly using light emitting diodes of claim 5, wherein each plate member is made of a thin metal plate.

7. The light source assembly using light emitting diodes of claim 1, wherein the at least one longitudinal edge of each reflective sheet having the uneven profile is connected to a longitudinal straight edge of an adjacent reflective sheet.

8. The light source assembly using light emitting diodes of claim 1, wherein each of two longitudinal edges of each reflective sheet has the uneven profile with a plurality of concave portions, and the two longitudinal edges are connected to two adjacent reflective sheets.

9. A light source assembly using light emitting diodes, comprising:
    a printed circuit board;
    a plurality of first reflective sheets mounted on the printed circuit board, each of the first reflective sheets comprising a first plate member;
    a plurality of second reflective sheets mounted on the printed circuit board, each of the second reflective sheets comprising a second plate member and a plurality of openings disposed on the second plate member; and
    a plurality of light emitting diodes mounted on the printed circuit board;
    wherein the plurality of first reflective sheets and the plurality of second reflective sheets are arranged in an interlacing manner, and the plurality of light emitting diodes are respectively disposed in the plurality of openings; and
    wherein each second reflective sheet includes at least one longitudinal edge having an uneven profile with a plurality of concave portions, and the plurality of openings are formed by the concave portions of the at least one longitudinal edge having the uneven profile.

10. The light source assembly using light emitting diodes of claim 9, wherein each of the first reflective sheets is disposed between two adjacent second reflective sheets.

11. The light source assembly using light emitting diodes of claim 9, wherein the first reflective sheets and the second reflective sheets reflect light emitted from the plurality of light emitting diodes.

12. The light source assembly using light emitting diodes of claim 9, wherein the first reflective sheet and the second reflective sheet are made of thin metal plate.

13. The light source assembly using light emitting diodes of claim 9, wherein the at least one longitudinal edge of each second reflective sheet having the uneven profile is connected to a longitudinal straight edge of an adjacent first reflective sheet.

14. A reflective sheet set, comprising:
    a first release sheet;
    a second release sheet; and
    a plurality of reflective sheets disposed between the first release sheet and the second release sheet, each reflective sheet comprising a plate member and a plurality of openings disposed on the plate member;
    wherein each reflective sheet includes at least one longitudinal edge having an uneven profile with a plurality of concave portions, and the plurality of openings are formed by the concave portions of the at least one longitudinal edge having the uneven profile.

15. The reflective sheet set of claim 14, wherein the first release sheet comprises a positioning hole disposed close to one edge thereof.

16. The reflective sheet set of claim 14, further comprising an adhesive disposed between the second release sheet and the plurality of the reflective sheets.

17. The reflective sheet set of claim 14, wherein the at least one longitudinal edge of each reflective sheet having the uneven profile is connected to an elongated straight edge of an adjacent reflective sheet.

* * * * *